United States Patent [19]

Hoppe et al.

[11] Patent Number: 4,563,575
[45] Date of Patent: Jan. 7, 1986

[54] IDENTIFICATION CARD HAVING AN EMBEDDED IC MODULE

[75] Inventors: Joachim Hoppe; Yahya Haghiri-Tehrani, both of Munich, Fed. Rep. of Germany

[73] Assignee: GAO Gesellschaft für Automation und Organisation mbH, Munich, Fed. Rep. of Germany

[21] Appl. No.: 366,597

[22] Filed: Apr. 8, 1982

[30] Foreign Application Priority Data

May 8, 1981 [DE] Fed. Rep. of Germany ....... 3118298

[51] Int. Cl.⁴ ............................................. G06K 19/06
[52] U.S. Cl. .................................... 235/492; 235/487; 235/488
[58] Field of Search ....................... 235/487, 488, 492

[56] References Cited

U.S. PATENT DOCUMENTS 4,200,227  4/1980  Lemelson ........................... 235/488

Primary Examiner—Harold I. Pitts
Attorney, Agent, or Firm—Andrus, Sceales, Starke & Sawall

[57] ABSTRACT

An identification card having an embedded IC module which is protected against external electric fields and electrostatic charges by means of measures of card technology or measures applied to the IC module itself. The IC module, along with the coupling means necessary for the operation of the module, is completely encased in an electrically conductive layer. The electrically conductive casings can be provided in the form of layers in the construction of the card, or on the IC module itself. The conductive casing according to the invention is well-suited both for opto-electronic and for galvanic data transmission.

19 Claims, 8 Drawing Figures

IDENTIFICATION CARD HAVING AN EMBEDDED IC MODULE

BACKGROUND OF THE INVENTION

The invention relates to an identification card having an embedded IC module for the processing of electrical signals.

The German Auslegeschrift No. 29 20 012 discloses an identification card having an embedded IC module. In this identification card, the module is attached to a separate carrier element along with all its leads and contacts, and is set into a window of the identification card, whereby the contact surfaces of the carrier element are located on the surface of the card and are freely accessible. IC modules of great complexity which are incorporated into identification cards should meet such requirements as needing little space, i.e. small dimensions for the component, and little energy consumption.

Complex integrated circuits having high packing density and little energy consumption are predominantly produced today with MOS technology.

As is generally known, MOS modules, i.e. circuits with high input resistance, are extremely sensitive to external electric fields or electrostatic charges.

There are therefore relevant regulations for dealing with IC modules with MOS technology, which must be strictly observed to protect the components. These concern both the production and storage and the processing of the IC module. Obviously, these regulations can only be partly observed when this type of module is incorporated into identification cards. In the above-mentioned publication, no particular protective steps are taken against possible damage of the IC module and contacts by external electric fields or electrostatic charges. Such fields and charges can endanger the sensitive module under unfavorable conditions even in normal daily use.

The potential danger for modules in MOS technology derives from the fact that the gate voltages may be between 20 and 500 V, depending on the type, and, due to the high input resistance, static charges are enough to make the voltage difference between the gate and the drain so large that the $SiO_2$ depletion layer is punctured and the component is destroyed or damaged. Static charges of this order of magnitude are not unusual in daily use under certain environmental conditions. Especially in the case of plastic identification cards, the static charges produced by friction and so on are a potential source of danger for the operability of IC modules in identification cards.

The object of the invention is thus to protect the IC module in identification cards to a large extent against external electric fields and electrostatic charges.

SUMMARY OF THE INVENTION

The object is achieved is solved according to the invention by completely encasing the IC module, including the coupling means necessary for the operation of the module, by an electrically conductive layer.

This protective step can be applied according to the invention both with the means of card technology and a corresponding treatment of the carrier element with its integrated IC module. When the protective steps are relegated to the sector of card technology, conductive materials or films are integrated into the card partially or over the entire card surface, or are used as cover layers and then connected conductively, so that a conductive casing of the IC module along with its coupling devices results, which performs the function of a Faraday shield. However it must be ensured that the coupling devices have no conductive connection with the conductive materials.

When the protective step according to the invention is applied to the carrier element having the IC module, the conductive casing is put onto the carrier element before the latter is incorporated into the card.

The protective step according to the invention is suitable for various methods of data transmission for IC modules. These methods of data transmission will be shown in the following, using the example of a carrier element protected according to the invention; they are also suitable, however, for cards protected by means of card technology.

In a contactless version, the communication between the IC module and the read/write device takes place by opto-electronic coupling. In this embodiment the carrier element is embedded so as to be insulated and is encased by a conductive sheath, whereby the insulating and conductive materials are transparent in the spectral range used for the optical coupling. This can be attained, for example, by means of correspondingly thin layers or known transparent conductive materials.

In the case of galvanic coupling, the carrier element along with the IC module and contact surfaces is also embedded completely in an insulating layer and encased by conductive material. In this case, however, the materials must not meet any particular optical demands, since the data are preferably picked up by thin contact pins which have an insulating casing apart from the point. The pins pierce the conductive and the insulating material to connect with the contact surfaces, whereby the layers preferably have elastic properties so that the openings in the layers close again to a large extent after contacting. Since the contact needles have an insulating casing, short-circuiting of the contact pins can be avoided in spite of the conductive casing in the case of this type of contacting.

The advantage of these embodiments is that the conductive layer forms a completely closed Faraday shield and static charges, if any, are located only on the surface of the conductive material and have no effect on the enclosed IC module. Thus identification cards in which the sensitive IC module has this type of protection are much less susceptible, as far as their operability is concerned, to electric fields and electrostatic charges than the usual identification cards having an IC module, for which no such protective steps are taken.

When the electrically conductive layer is to encase the carrier element completely, the layer can be applied without any particular protective measures, most simply by dipping and spraying techniques. It is neither necessary nor desirable to cover contacts, etc., temporarily, so that no mask of any type is needed during encasing.

When thermoplastic, elastically conductive or conductively coated films are used, usual card techniques can be used as well which do not require any additional measures during the production of the card in spite of the inclusion of the protective measures according to the invention. The invention thus exhibits a high protective factor which can be attained with a negligeable additional effort.

BRIEF DESCRIPTION OF THE DRAWINGS

Further details of the invention emerge from the figures specified in the following.

DESCRIPTION OF THE PREFERRED EMBODIMENT

Figure 1:
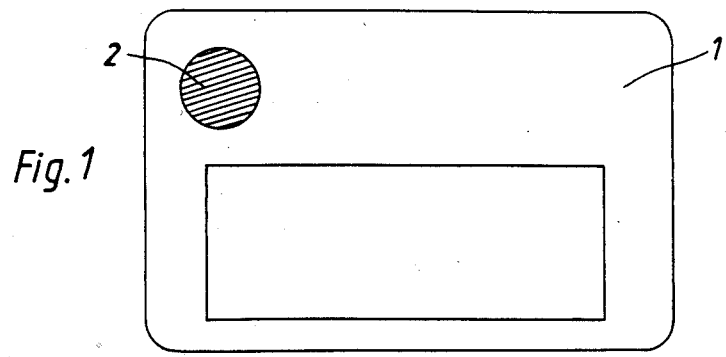
FIG. 1: identification card having an IC module.
Figure 6:
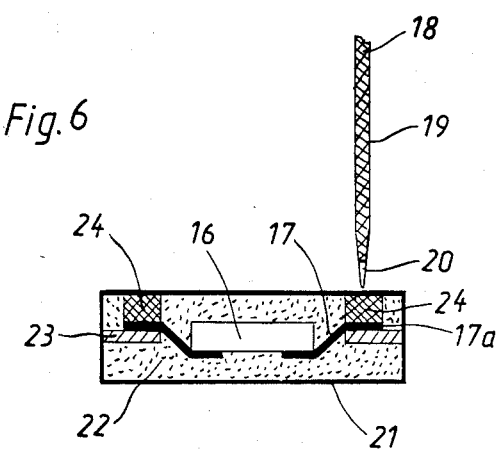
FIG. 6: carrier element with galvanic coupling.
Figure 7:
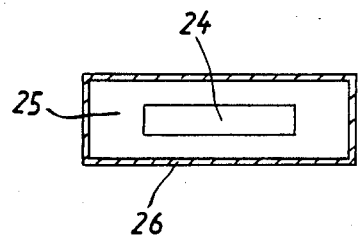
FIG. 7: carrier element with opto-electronic coupling.

FIG. 1 shows an identification card 1 in which the carrier element with the IC module 2 is embedded, whereby the protection of the sensitive IC module according to the invention is attained by measures of card technology or measures carried out directly on the carrier element. FIGS. 2, 3, 4 and 5 show various embodiments of the protection attained by measures of card technology. Further measures carried out directly on the carrier element are shown in FIGS. 6 and 7.

Figure 2:
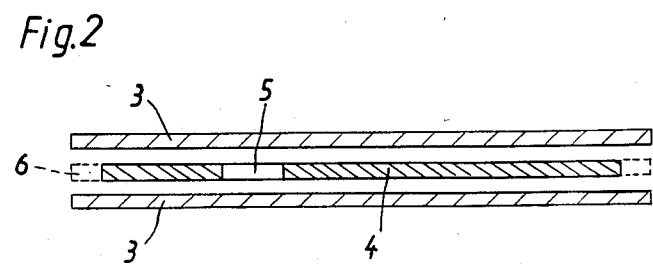
FIGS. 2,3,4,5: protective measures of card technology.

In FIG. 2 the carrier element and IC module 5 are set into a recess in card inlay 4 and laminated between two electrically conductive films 3. If the inlay 4 is not conductive, care must be taken that conductive cover films 3 are connected conductively at the edge, e.g. by electrically conductive frame 6, which can be made of the same material as cover films 3. Another way of establishing an electrically conductive connection between the edges of the cover films 3 makes use of the well-known techniques of producing identification cards with bonded edges, in connection with electrically conductive films (see e.g. German Patent Specification No. 27 56 691).

Figure 3:
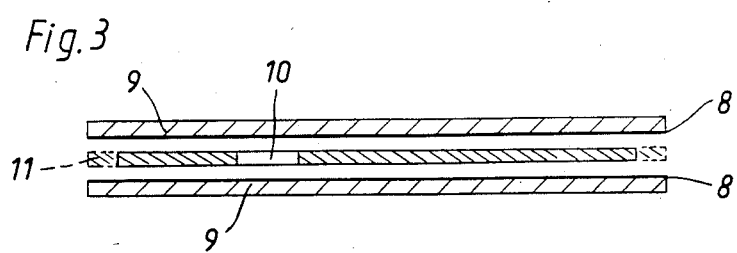

FIG. 3 shows another embodiment of an identification card with an IC module protected according to the invention, in which PVC films are used, for example, as cover films 9, having a conductive coating 8 on the inside. If the conductive coating 8 is not transparent, the printed pattern is located between cover film 9 and conductive coating 8. The conductive connection at the edge can be produced again by means of a conductive film frame 11 by one of the methods depicted above.

Figure 4:
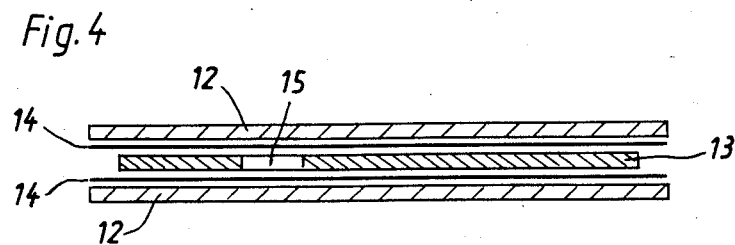

In the embodiment shown in FIG. 4, the conductive layer 14 consists of a conductive layer or film embedded between laminating film 12 and card inlay 13. The card inlay, however, is altogether narrower than layers 14, so that the latter can form a connection during lamination.

Figure 5:
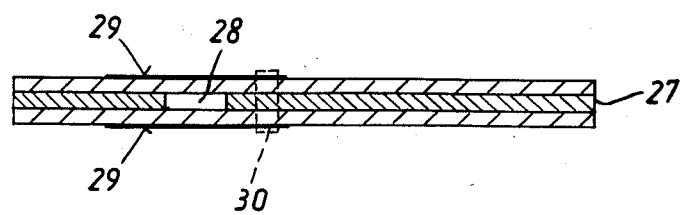

FIG. 5 shows an identification card protected according to the invention, in which electrically conductive layers 29 are applied to the front and back of card 27 in the area of carrier element 28. Layers 29 can be applied, for example, by printing or as a conductive varnish. If the transparency is sufficient, layers 29 can also extend over the entire contacting surface. The important aspect of this embodiment is the conductive connection 30 between the layers, which consists of a kind of through-hole contacting, whereby a narrow, conductive metal strip, for example, is put through a narrow opening in the card, bent back before or during lamination and possibly pressed into the identification card. This type of edge connection is also suitable for the embodiments depicted above, whereby the fact that the Faraday shield is not completely closed throughout the thickness of the card will be dealt with in more detail in the following.

FIG. 6 shows a carrier element with an IC module 16 for galvanic coupling according to the invention. IC module 16, held by leads 17 and cast with insulating material 22, is located in a window of film carrier 23. In the area of contact surfaces 17a recesses are provided which are filled with an elastic insulating material 24. In this case insulating material 22 can be as rigid as one chooses. Depending on the particular application, however, complete embedding in elastic insulating material is also conceivable, which makes recesses and additional elastic insulating materials 24 unnecessary and thus simplifies the production of the carrier element. If contacts 17a are made thick enough (additional contact holes, etc.) the insulating layer over the contacts can be correspondingly thin, thus also allowing for the use of less elastic materials. The entire arrangement is then encased by a conductive layer 21, which can also be made of elastic material. The data are picked up by means of thin contact pins 18 which are provided with an insulating casing 19 except on their point 20. To connect with contact surfaces 17a the contact pins 18 pierce elastic conductive layer 21 and elastic insulating material 24, until points 20 touch contact surfaces 17a. Insulating casing 19 extends into the area of the contact points so that the needles are not short-circuited by the conductive layer 21 when in their testing position.

After contacting, elastic layers 24 and 21 can close again in the area of the openings, so that the Faraday shield is closed again. Conductive layer 21 can be produced, for example, by vaporizing a conductive material onto the carrier element or dipping it into a conductive varnish.

Another embodiment of the invention is the arrangement with opto-electronic coupling shown in FIG. 7. An IC module with this coupling method is described by way of example in German Offenlegungsschrift No. 29 26 867. FIG. 7 shows an IC module 24 of this construction, surrounded by an insulating layer, which is transparent in the spectral range used for the opto-electronic coupling. Conductive casing 26 of the entire arrangement must also be transparent in this spectral range.

But it is also possible to have only the areas of the casing 25,26 be optically transparent which are above the light-sensitive or light-emitting components used for coupling and energy supply. The optical transparency can be realized by transparent materials, very thin layers, lattices or net-shaped casings. It is advantageous in the case of opto-electronic coupling methods that, even when the card is used for a very long time, casings 11,12 always remain completely closed and no fatigue of the material due to frequent contacting can lead to a reduction in the protective effect due to remaining openings caused by the contact pins.

The strength of an external field, the diameter of the openings and the distance between the component to be protected and the openings are crucial for the potential reduction of the protective effect. It is thus also possible to form the conductive layer as a lattice under certain conditions, e.g. when the fields are weak or the distance between the component to be protected and fairly small openings is large. It is then unnecessary to make the conductive layer elastic as in the case of the galvanic coupling described above, since contacting can take place through the mesh openings of this sort of Faraday shield.

In the case of opto-electronic coupling, the transparent property of the conductive layer may also be dispensed with in certain cases, when an electrically conductive grating is used and sufficient light passes through the openings for energy and data transmission.

When the above-mentioned conditions are met, it is also possible in the case of protective measures according to card technology to form the conductive layers or inlaid films or materials as a lattice or to use films printed with conductive material in a net pattern. The conductive surfaces or lattices need not extend over the entire area of the card, but must only cover the area of the carrier element, as shown for example in FIG. 5, and be connected conductively at one place on the edge, e.g. by the above-mentioned type of through hole contacting. The reduction of the protective effect is negligeable in the case of thin cards, so that the function of acting as a Faraday shield is retained.

Figure 8:
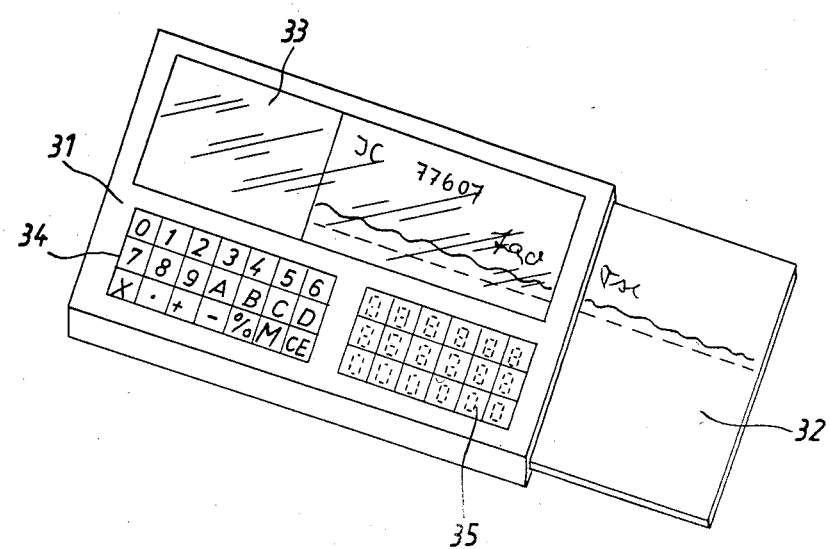
FIG. 8: identification card with case to protect it against electric fields.

In another emobidment, which is shown in FIG. 8, the intended protection against electrostatic fields is achieved by means of a "detachable" Faraday shield, which can be separated from the identification card and thus removed from the card during data transmission. Using this idea as a base, identification card 32 is kept permanently in a case having a conductive coating on the inside. Case 31 with card 32 is inserted, for the purpose of read/write operation, into a corresponding automaton which automatically removes the card from the case and pushes it back into case 31 after the communication process is over. As shown in FIG. 8, case 31 can also be designed as a portable pocket terminal having a display window 33 for optical information on identity when used non-automatically, e.g. at the bank counter, a keybord 34 and a display 35 allowing the customer to recall the present state of his account or other stored information. In addition, a small calculator provided with a memory can also be provided which allows for external financial calculations as well without affecting the contents of the IC module memory in the identification card. The case can further be provided with a cleaning mechanism to remove dirt from the identification card and possibly also the contacts located on the surface. This is especially interesting when the identification card can be removed from its case by the card owner. In a simple embodiment, the calculator, display and keyboard can be dispensed with, so that the case only functions as protection against external mechanical and electrical influences. The identification card and its IC module are thus constantly located within a Faraday shield during normal use and are thus protected from the effect of static charges or electric fields. It is an advantageous feature of these embodiments that they do not require any special materials or special methods to produce the card and carrier element, but can be used for practically any type of card having an IC module. This embodiment can thus be used as well as a subsequent protective measure for identification cards without an integrated Faraday shield which have already been produced.

What is claimed is:

1. An identification card having an embedded IC module for the processing of electrical signals, characterized in that the IC module including the coupling means necessary for the operation of the module is completely encased by an electrically conductive layer.

2. An identification card as in claim 1, characterized in that the electrically conductive casing is designed as a lattice or a net.

3. An identification card as in claim 1 or 2, characterized in that the electrically conductive casing is designed as a thin, e.g. vaporized, layer.

4. An identification card as in claim 1 or 2, characterized in that the electrically conductive casing has elastic properties.

5. An identification crad as in claim 1, characterized in that the electrically conductive casing is transparent in the spectral range used for opto-electronic coupling.

6. An identification card as in claim 1, characterized in that the electrically conductive casing is provided in the construction of the card.

7. An identification card as in claim 1, characterized in that the IC module has a carrier element and the electrically conductive casing is provided at the carrier element itself.

8. An identification card as in claim 1, characterized in that the electrically conductive casing is designed as a film or cover film.

9. An identification card as in claim 8, characterized in that the electrically conductive cover films have an electrically conductive bonded edge.

10. An identification card as in claim 8, characterized in that the electrically conductive layers are provided partially in the area of the IC module in the construction of the card or on the cover films.

11. An identification card as in claim 10, characterized in that the conductive layers are connected conductively with each other by a type of through hole contacting.

12. An identification card as in claims 10 and 11, characterized in that the conductive layers are partially printed or stuck on and then connected conductively.

13. An identification card as in claims 10 and 11, characterized in that the partial conductive layers are designed as a lattice or a net.

14. An identification card as in claim 1, characterized in that the electrically conductive casing can be removed from the card.

15. An identification card as in claims 1 and 14, characterized in that the electrically conductive casing is designed as a protective case.

16. An identification card as in claim 14, characterized in that the electrically conductive casing contains a display window, which is also conductive, to make important contacts visible.

17. An identification card as in claims 14 or 16, characterized in that the electrically conductive case is provided with a contacting unit and a communication device.

18. An identification card as in claim 1, characterized in that the case is provided with a cleaning device for the contacts and the card.

19. A device for operating the identification card as in claim 1, characterized in that for galvanic contacting the contact pins (18) are provided with an insulating casing (19) except for their point (20).

* * * * *